(12) United States Patent
Doyle et al.

(10) Patent No.: US 11,417,705 B2
(45) Date of Patent: Aug. 16, 2022

(54) RRAM MEMORY CELL AND PROCESS TO INCREASE RRAM MATERIAL AREA IN AN RRAM MEMORY CELL

(71) Applicant: Intel Corporation, Santa Clara, CA (US)

(72) Inventors: Brian Doyle, Portland, OR (US); Prashant Majhi, San Jose, CA (US); Elijah Karpov, Portland, OR (US); Ravi Pillarisetty, Portland, OR (US); Ashishek Sharma, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 811 days.

(21) Appl. No.: 16/147,555

(22) Filed: Sep. 28, 2018

(65) Prior Publication Data

US 2020/0105834 A1      Apr. 2, 2020

(51) Int. Cl.
*H01L 27/24*     (2006.01)
*H01L 45/00*     (2006.01)
*G11C 13/00*     (2006.01)

(52) U.S. Cl.
CPC ........ *H01L 27/2463* (2013.01); *G11C 13/003* (2013.01); *G11C 13/0028* (2013.01); *H01L 45/1233* (2013.01); *H01L 45/1253* (2013.01); *H01L 45/146* (2013.01); *H01L 45/1675* (2013.01)

(58) Field of Classification Search
CPC ............. H01L 27/2463; H01L 45/1233; H01L 45/1253; H01L 45/146; H01L 45/1675; G11C 13/0028; G11C 13/003
USPC .......................................................... 257/4
See application file for complete search history.

(56) References Cited

U.S. PATENT DOCUMENTS

2010/0219392 A1\* 9/2010 Awaya ................ H01L 27/0688
                                                                257/3
2019/0036013 A1\* 1/2019 Mo ....................... G11C 11/161

\* cited by examiner

*Primary Examiner* — Tu-Tu V Ho
(74) *Attorney, Agent, or Firm* — Schwabe, Williamson & Wyatt, P.C.

(57) ABSTRACT

A memory cell is disclosed. The memory cell includes a word line contact, a cylindrical electrode having a top region and a bottom region, and RRAM material covering the surface of the cylindrical electrode from the top region to the bottom region. A select transistor contact is coupled to the bottom region of the cylindrical electrode.

21 Claims, 9 Drawing Sheets

RRAM MEMORY CELL AND PROCESS TO INCREASE RRAM MATERIAL AREA IN AN RRAM MEMORY CELL

TECHNICAL FIELD

Embodiments of the disclosure pertain to RRAM memory cells and, in particular, to increasing RRAM material area in an RRAM memory cell.

BACKGROUND

RRAM, also known as ReRAM (resistive random access memory), is a form of nonvolatile storage that operates by changing the resistance of a specially formulated solid dielectric material. An RRAM device contains a component called a memristor whose resistance varies when different voltages are imposed across it.

Normally, a dielectric material does not conduct electric current. However, if the dielectric material is subjected to a high enough voltage, it will suddenly conduct because of dielectric breakdown. In a conventional dielectric material, dielectric breakdown causes permanent damage and failure of the associated component. In a memristor, the dielectric breakdown is temporary and reversible because of the materials that are used. In one form of memristor, a deliberately applied voltage causes the medium to acquire microscopic conductive paths called filaments. The filaments appear as a result of various phenomena such as metal migration or physical defects. Once a filament appears, it can be broken or reversed by the application of a different external voltage. The controlled formation and destruction of filaments in large numbers allows for storage of digital data. The voltage that is used initially to cause the medium to acquire the microscopic conductive paths is called the forming voltage.

The application of the forming voltage is generally a one-time event that configures the RRAM structure for switching between conductive and non-conductive states. However, as the dimensions of RRAM devices decrease as a part of the scaling that occurs from one generation of the technology to the next, their forming voltages increase. Charge pump circuitry is used to generate the high forming voltages that are required. However, the presence of the charge pump circuitry on a die consumes a significant amount of space and limits the ability to reduce RRAM devices to smaller sizes. Thus, generational scaling can be prevented.

DESCRIPTION OF THE EMBODIMENTS

Figure 1A:
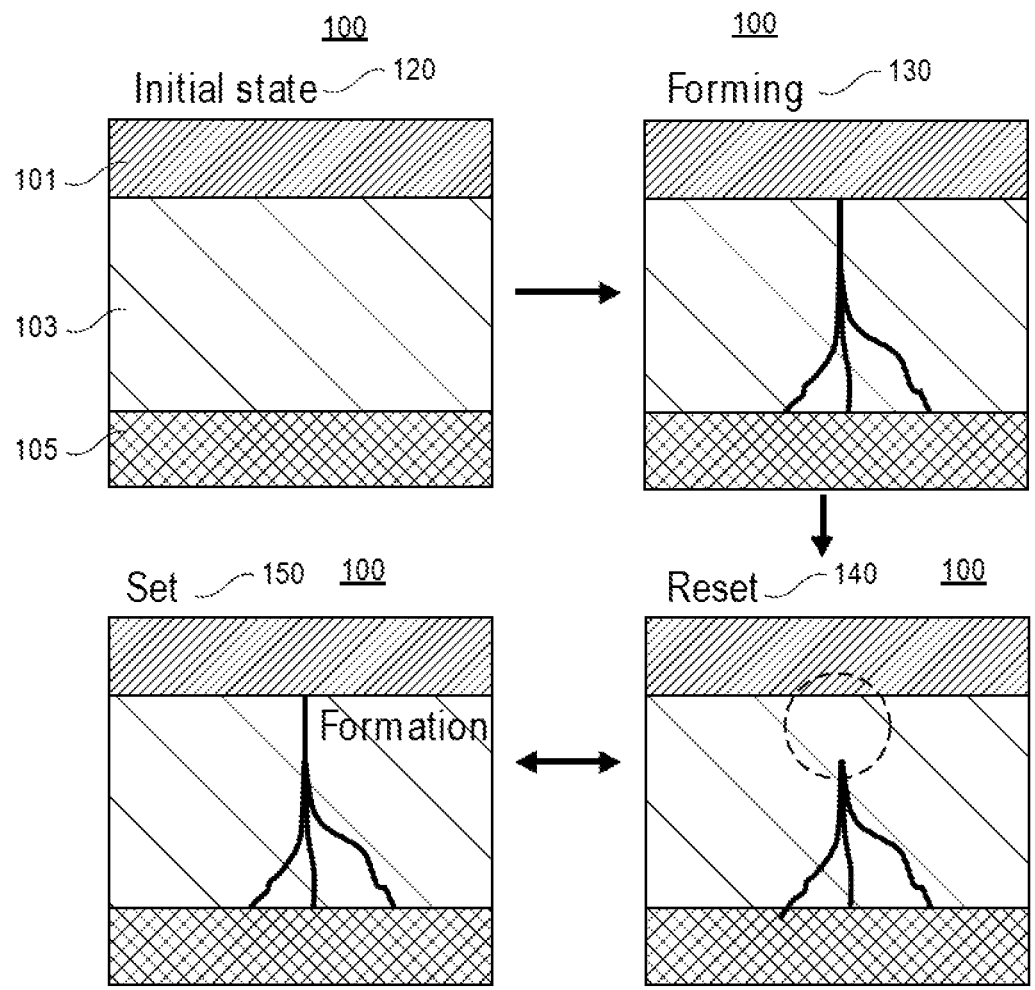
FIG. 1A are illustrations of cross-sections of an RRAM structure corresponding to RRAM memory cell formation and normal operation according to an embodiment.

Approaches to increasing RRAM material area in an RRAM memory cell are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

A shortcoming of previous approaches to providing sufficiently high forming voltages for RRAM devices, as RRAM device sizes decrease, and requisite forming voltages increase, is the reliance on significant amounts of charge pump circuitry. A process and device that overcomes the shortcomings of such approaches is disclosed herein. As part of a disclosed approach, the RRAM material that is used to form RRAM memory cells is formed around cylindrical conductive vias or posts. Consequently, the area of the RRAM material is no longer the top-down area of the resistor, but the area of the cylindrical post around which the RRAM is wrapped. Accordingly, RRAM material that has a much greater area than can be provided by a conventional RRAM memory cell of the same size is enabled. The greater area of the RRAM material eliminates the need to incorporate charge pumps for purposes of generating higher voltages. Moreover, the amount of die space that is saved enables continued memory cell scaling.

FIG. 1A shows cross-sectional views of an RRAM device 100 in a flow diagram that illustrates RRAM memory cell formation and normal operation according to an embodiment. In FIG. 1A, RRAM device 100 includes top electrode 101, switching layer 103 and bottom electrode 105.

Referring to FIG. 1A, a forming voltage is applied across the RRAM device 100 to cause the formation of a conductive path in the switching layer 103. Thereafter, the RRAM device 100 can be switched between conductive and non-conductive states by the application of an appropriate voltage. For example, at 120, the switching layer 103 is initially in a highly resistive, non-conductive state. At 130, during the "forming" process, conducting paths are formed in the switching layer 103 as a result of the application of a high voltage that switches the RRAM into a low-resistance state. At, 140, the RRAM device 100 in a low resistance state is switched to a high-resistance state as a result of the application of a "reset voltage." And, at 150, the RRAM is switched from the high resistance state to a low resistance state by applying a "set voltage."

The application of the forming voltage is a one-time event that is required to configure the RRAM device 100 for switching between the conductive and non-conductive states.

It should be appreciated that as the dimensions of RRAM devices decrease as a part of the scaling that occurs from one generation of the technology to the next, the forming voltage increases significantly (see FIG. 1B and related discussion below).

Figure 1B:
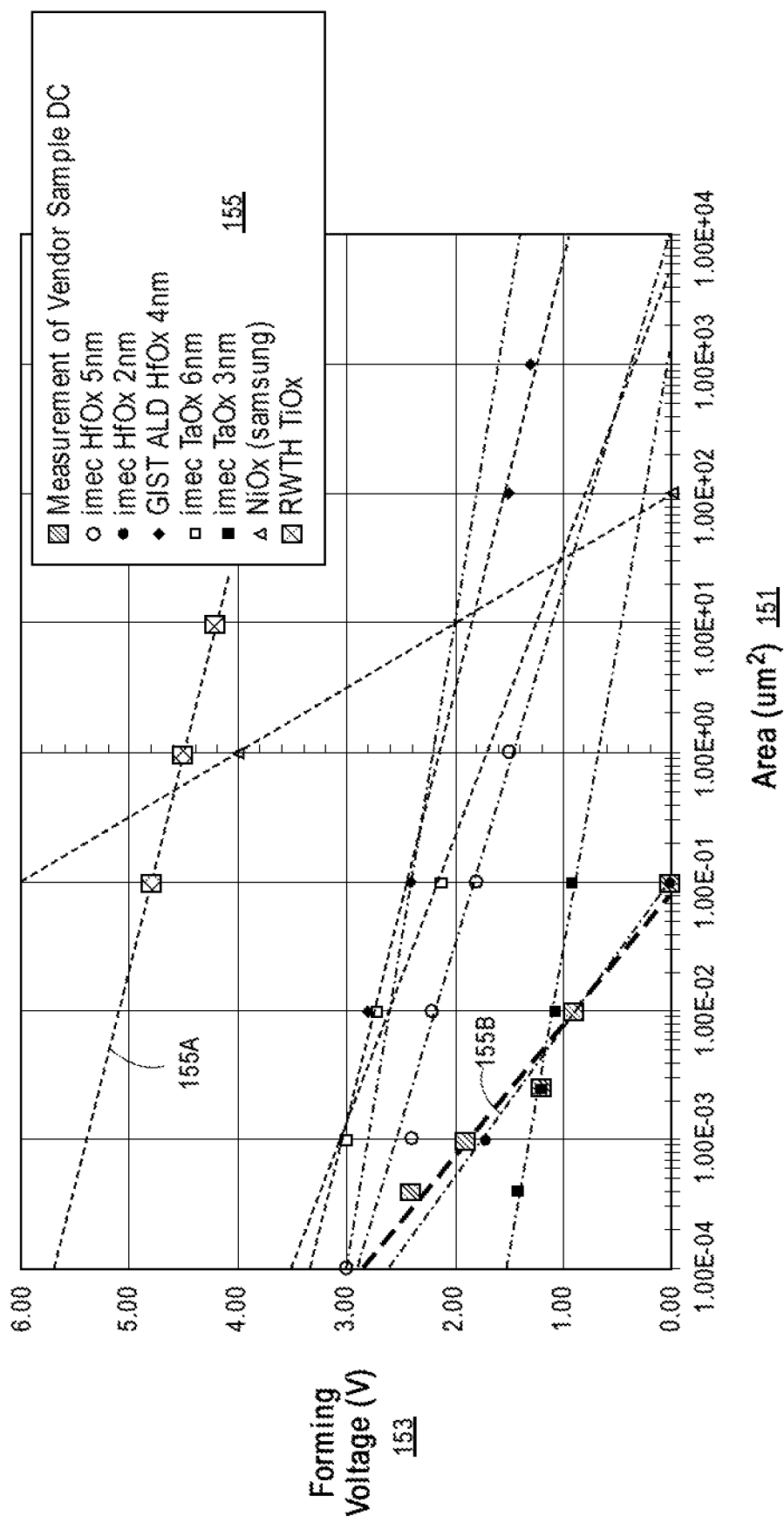
FIG. 1B is a graph of required forming voltage as a function of the area of the RRAM.

FIG. 1B is a graph that illustrates characteristics of forming voltage 153 as a function of RRAM device area 151 with respect to various RRAM materials 155. Referring to FIG. 1B, in general, the forming voltage 153 for RRAM materials 155 rise as RRAM device area 151 decreases. However, there are differences among the materials regarding the magnitude of the forming voltage at various RRAM device areas and/or the steepness of the rise in the forming voltage as the RRAM device area increases. For example, TiOx 155a has a higher forming voltage, at greater RRAM device areas than other RRAM materials, that increases gradually from the high base as the RRAM device decreases in area. In contrast, HfOx 155b has a lower forming voltage, at smaller RRAM device areas than other RRAM materials, that rises more steeply than does TiOx 155a as the RRAM device decreases in area. In either case, the rise of forming voltages 153 for the RRAM material 155 as the RRAM device area 151 decreases can lead to array inefficiency as large charge pumping circuitry can become necessary to support the higher forming voltages. It should be appreciated that the illustrated characteristics of forming voltage as a function of RRAM device area are only exemplary and in other cases other characteristics can be exhibited.

Figure 2A:
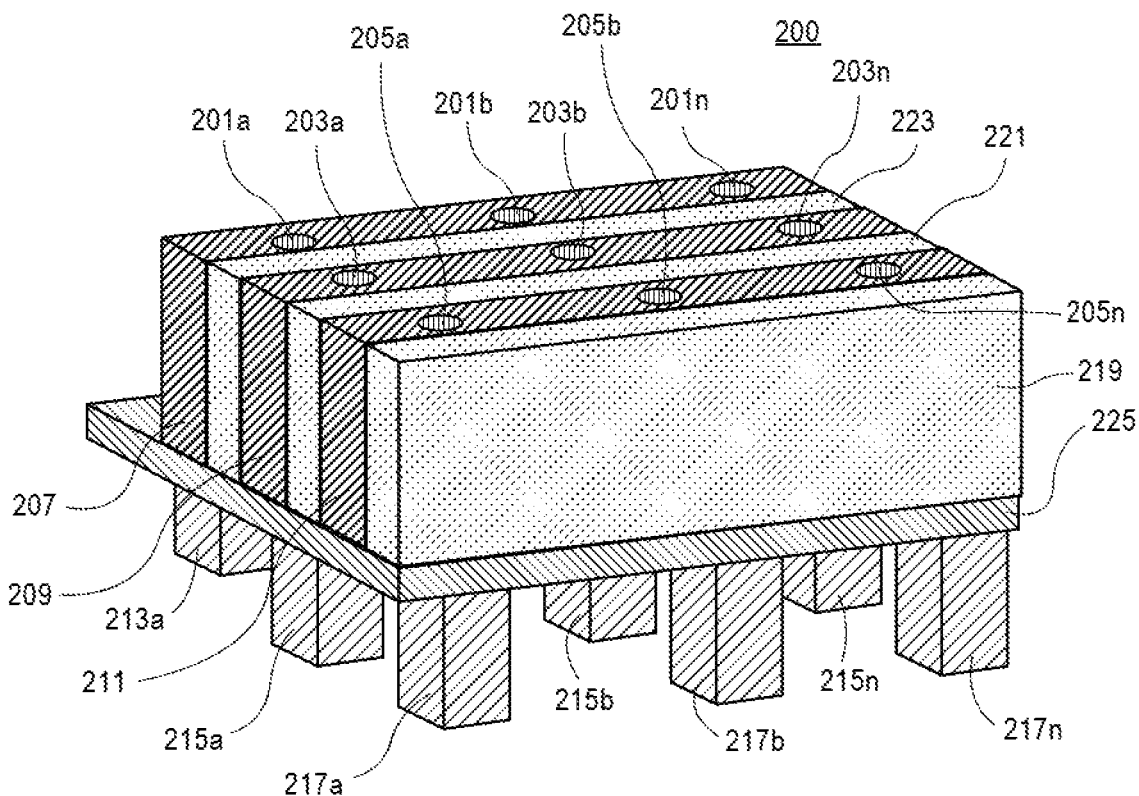
FIG. 2A is an illustration of a memory cell array with memory cells that maximize RRAM component space according to an embodiment.

FIG. 2A is an illustration of a memory cell array 200 with memory cells that maximize RRAM component area according to an embodiment. FIG. 2A shows memory cells 201a-201n, memory cells 203a-203n, memory cells 205a-205n, word line 207, word line 209, word line 211, select transistor contacts 213a-213n, select transistor contacts 215a-215n, select transistor contacts 217a-217n, insulator 219, insulator 221, insulator 223 and insulator 225.

Referring to FIG. 2A, the memory cells 201a-201n, the memory cells 203a-203n, and the memory cells 205a-205n are formed in the word line 207, the word line 209 and the word line 211, respectively. The memory cells 201a-201n are coupled to the select transistor contacts 213a-213n. The memory cells 203a-203n are coupled to the select transistor contacts 215a-215n. The memory cells 205a-205n are coupled to the select transistor contacts 217a-217n. The word line 207 and the word line 209 are separated by the insulator 223. The word line 209 and the word line 211 are separated by the insulator 221. The insulator 219 is formed adjacent to the word line 211. The word lines 207-211 and the insulators 219-223 are formed above the insulator layer 225. The select transistor contacts 213a-213n, the select transistor contact 215a-215n and the select transistor contact 217a-217n are formed in underneath the insulator layer 225.

Figure 2B:
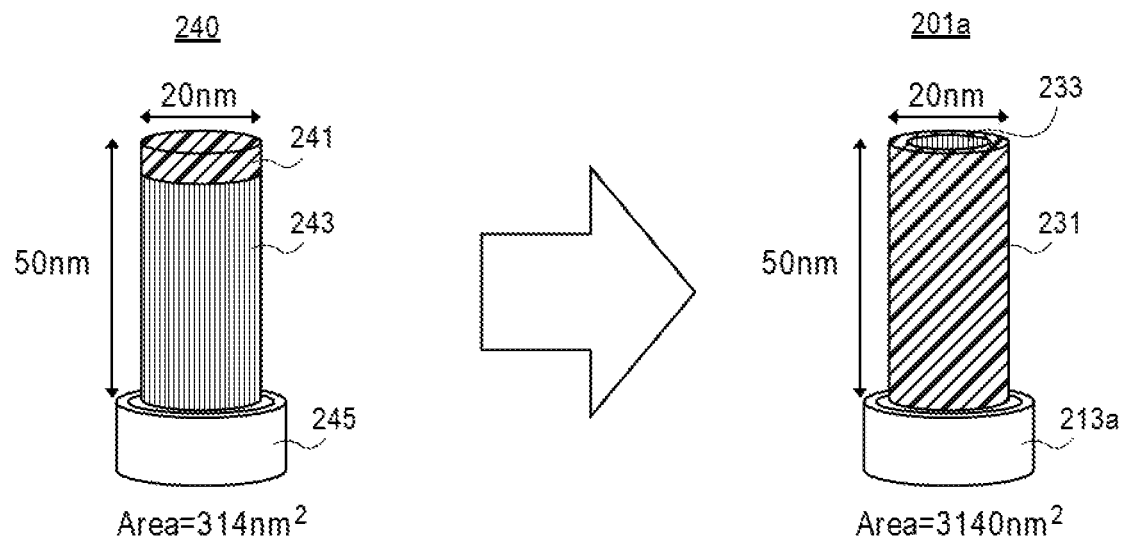
FIG. 2B shows the structure of the memory cell according to an embodiment and the structure of a memory cell of a previous approach.

FIG. 2B is an illustration of the structure of the memory cell 201a of FIG. 2A and the structure of a memory cell 240 of a previous approach. In FIG. 2B, memory cell 201a includes RRAM material 231, bottom electrode 233 and select transistor contact 213a. Memory cell 240 includes RRAM material 241, bottom electrode 243 and select transistor contact 245. Referring to FIG. 2B, with regard to memory cell 201a, RRAM material 231 is formed around the bottom electrode 233 which is formed in the shape of a cylindrical post or plug that extends upwards from the transistor contact 213a. In contrast, with regard to memory cell 240, RRAM material 241 is formed on the planarized top surface of the bottom electrode 243. In the example embodiment shown in FIG. 2B, because the RRAM material 231 of memory cell 201a, is deposited around the cylindrical bottom electrode 233, as opposed to on the top of a planarized surface of a bottom electrode as in the memory cell 240, the surface area of the RRAM device 201a is increased by a factor of ten (as shown in FIG. 2B from 314 nm2 to 3140 nm2). In other embodiments, other configurations of RRAM devices in accordance with embodiments can result in other levels of increases in the RRAM material area of the RRAM device.

Referring again to FIG. 2A, the RRAM material of memory cells 201a-201n, memory cells 203a-203n, memory cells 205a-205n can be formed from binary oxides, ternary and more complex oxides, chalcogenides, nitrides, amorphous-silicon/carbon, and some organic materials. For example, RRAM oxides can include but are not limited to TaOx, SiOx, HfOx, AlOx, ZrOx, TiOx, NiOx, WOx, NbOx or combinations of these. In other embodiments, the RRAM material of memory cells 201a-201n, memory cells 203a-203n, and memory cells 205a-205n can be formed from any other suitable material. In an embodiment, the word line 207, the word line 209 and the word line 211 can be formed from metallic or polysilicon material. In other embodiments, the word line 207, the word line 209 and the word line 211 can be formed from other materials. In an embodiment, the select transistor contact 213, the select transistor contact 215, and the select transistor contact 217 can be formed from Ti, Al or W. In other embodiments, the select transistor contact 213, the select transistor contact 215, and the select transistor contact 217 can be formed from other materials. In an embodiment, insulator 219, insulator 221 and insulator 223 can be formed from silicon dioxide. In other embodiments, insulator 219, insulator 221 and insulator 223 can be formed from other materials. In an embodiment, insulator 225 can be formed from silicon nitride. In other embodiments, insulator 225 can be formed from other materials.

In operation, data can be stored in, and accessed from, the memory cells 201a-201n, 203a-203n and 205a-205n. In an embodiment, because the memory array 200 is constructed without charge pumps to support the higher forming voltages as are necessary in previous approaches, continued generation to generation scaling is enabled. Thus, array efficiency is improved making memory array 200 suitable for next generation level memory array performance.

Figure 3A:
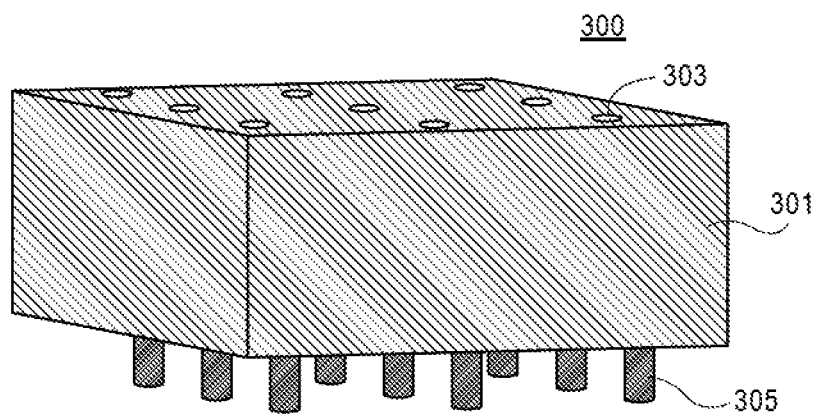
FIGS. 3A-3J are illustrations of cross-sections of a semiconductor structure at stages of the fabrication of an RRAM memory cell array according to an embodiment.

FIGS. 3A-3J are illustrations of cross-sections of a semiconductor structure 300 at various stages during the fabrication of an RRAM memory cell array according to an embodiment. Referring to FIG. 3A, semiconductor structure is shown after the formation of an interlayer dielectric 301, vias 303 and bottom contacts 305. In an embodiment, the interlayer dielectric 301 can be formed by deposition. In other embodiments, the interlayer dielectric 301 can be formed in other suitable manners. In an embodiment, the vias can be formed by patterning. In other embodiments, the vias can be formed in other suitable manners.

Figure 3B:
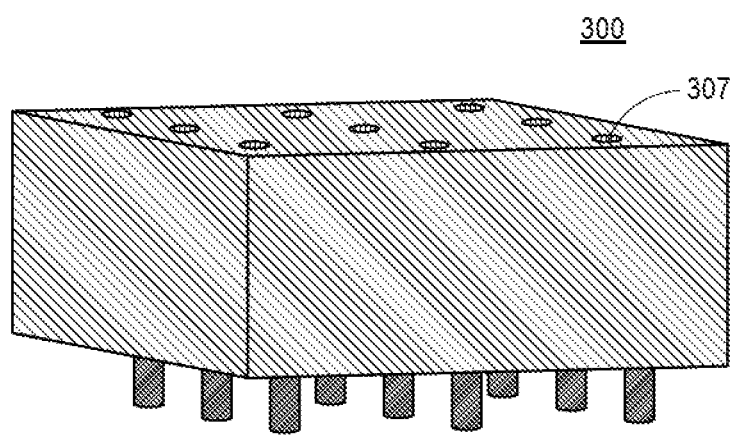

Referring to FIG. 3B, after one or more operations that result in the cross-section shown in FIG. 3A, the vias 303 are filled with conductive material 307 and excess conductive material 307 present on the surface of semiconductor structure 300 is removed. In an embodiment, the conductive material 307 can be metal. In other embodiments, other conductive material can be used. In an embodiment, the conductive material is removed from the surface of the semiconductor structure 300 by polishing. In other embodiments, conductive material can be removed from the surface of the semiconductor structure 300 in other suitable manners.

Figure 3C:
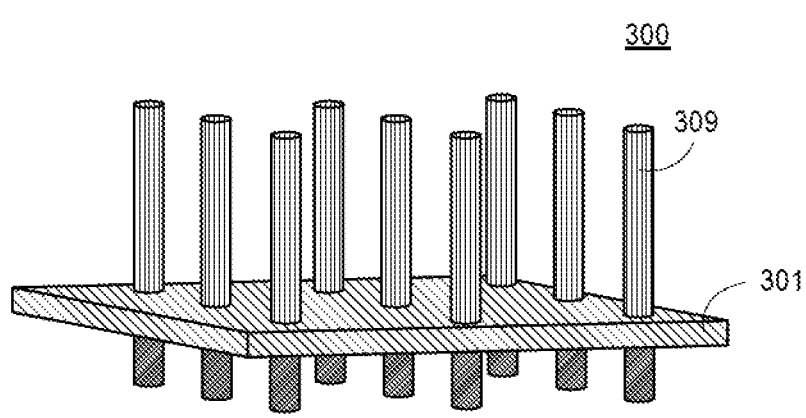

Referring to FIG. 3C, after one or more operations that result in the cross-section shown in FIG. 3B, a portion of the interlayer dielectric 301 is removed exposing cylindrical plugs, posts, or pillars 309. In an embodiment, a layer of the interlayer dielectric 301 is left near the bottom of the plugs, posts, or pillars 309.

Figure 3D:
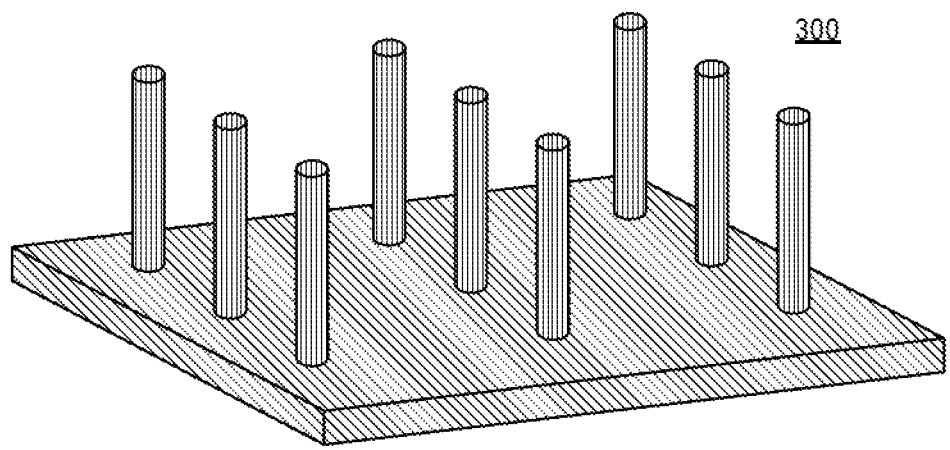

Referring to FIG. 3D, a perspective view of the semiconductor structure 300 of FIG. 3C is shown.

Figure 3E:
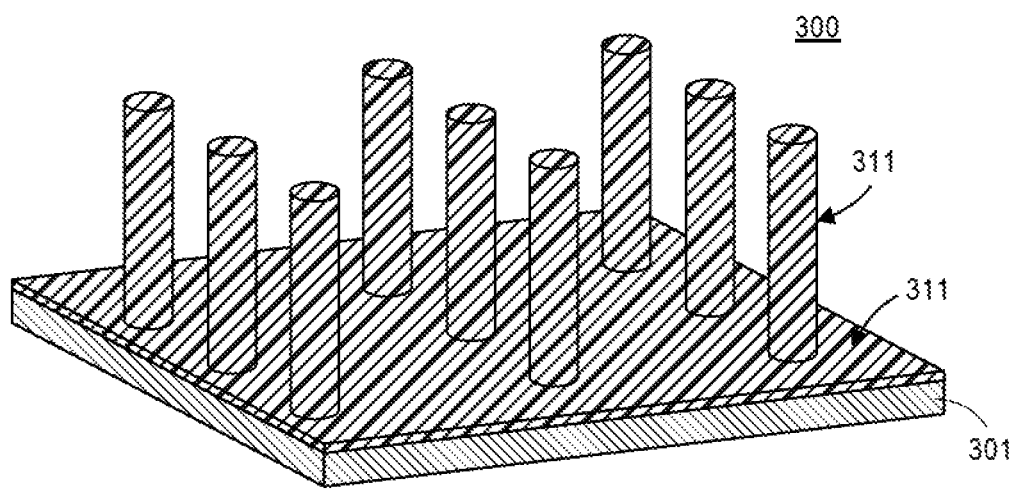

Referring to FIG. 3E, after one or more operations that result in the cross-section shown in FIG. 3D, RRAM material 311 is formed on the plugs, posts, or pillars 309 and on the top surface of the interlayer dielectric 301. In an embodiment, the RRAM material 311 can be deposited on the plugs, posts, or pillars 309 using ALD. In other embodiments, the RRAM material 311 can be deposited on the plugs, posts, or pillars 309 in other suitable manners.

Figure 3F:
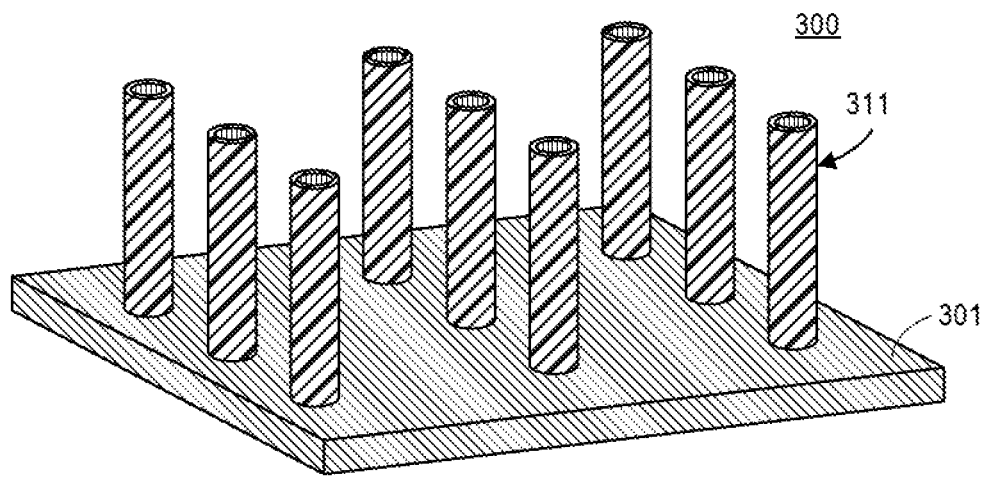

Referring to FIG. 3F, after one or more operations that result in the cross-section shown in FIG. 3E, the RRAM material 311 is removed from the top surface of the interlayer dielectric 301. In an embodiment, the RRAM material 311 is removed from the top surface of the interlayer dielectric 301 by reactive ion etch (RIE). In other embodiments, the RRAM material 311 can be removed from the top surface of the interlayer dielectric 301 by using other suitable manners of removing the RRAM material.

Figure 3G:
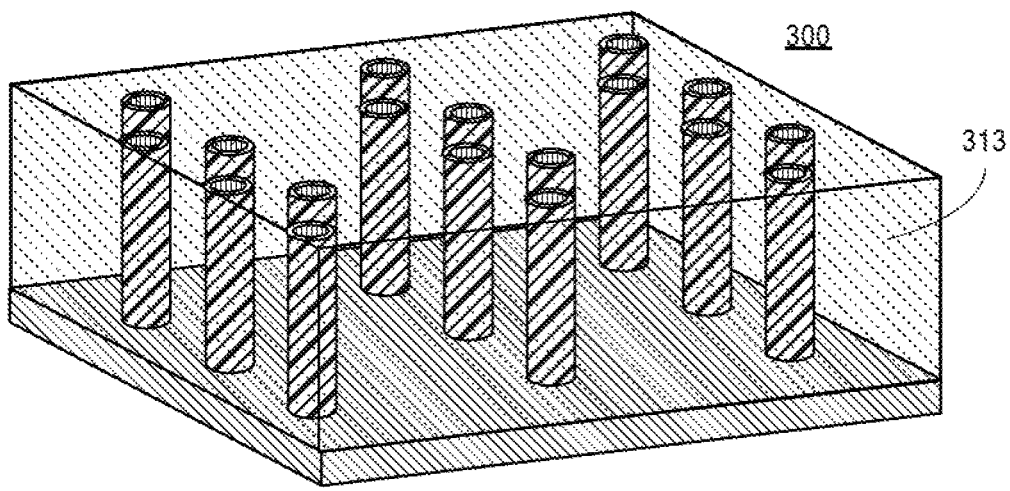

Referring to FIG. 3G, after one or more operations that result in the cross-section shown in FIG. 3F, an interlayer dielectric 313 is formed on the semiconductor structure 300 that covers the plugs, posts, or pillars 309 and subsequently planarized. In an embodiment, the surface of the interlayer dielectric 313 is planarized by polishing. In other embodiments, the surface of the interlayer dielectric 313 is planarized in other suitable manners.

Figure 3H:
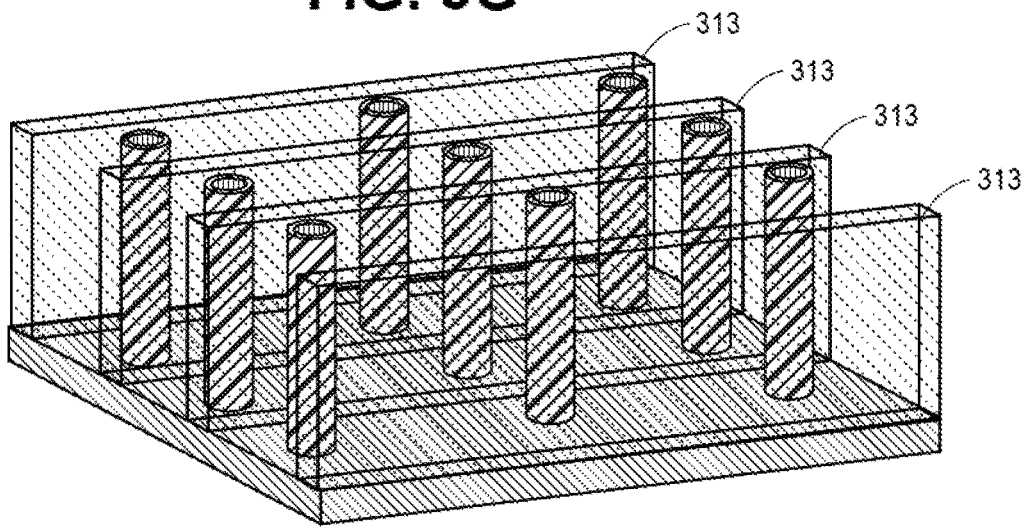

Referring to FIG. 3H, after one or more operations that result in the cross-section shown in FIG. 3G, portions of the interlayer dielectric 313 are removed to expose RRAM plugs, pillars or posts. In an embodiment, the portions of the interlayer dielectric 313 are removed to expose RRAM plugs, pillars or posts 309 by etching. In other embodiments, the portions of the interlayer dielectric 313 can be removed to expose the RRAM plugs, pillars or posts 309 in other suitable manners.

Figure 3I:
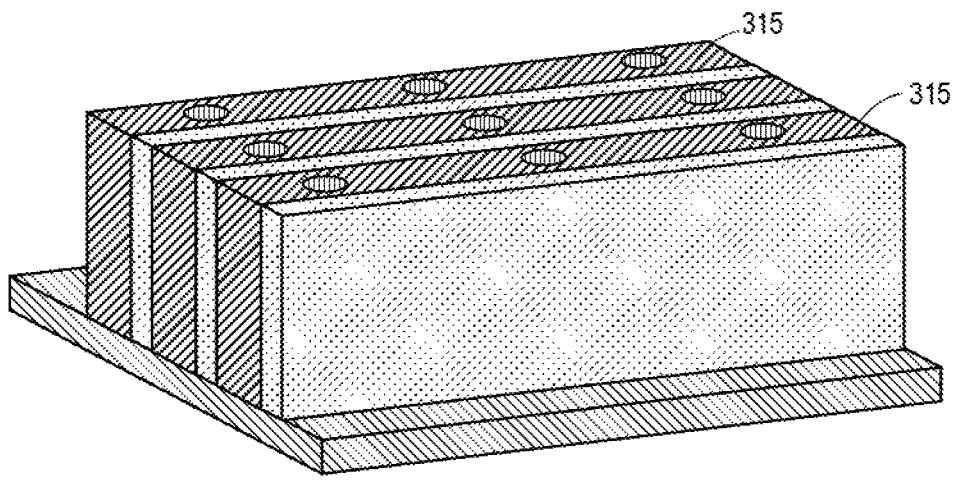

Referring to FIG. 3I, after one or more operations that result in the cross-section shown in FIG. 3H, conductive material 315 is formed on the semiconductor structure to surround the exposed RRAM plugs, pillars or posts 309. In addition, the conductive material is planarized such that the tops of the RRAM plugs, pillars or posts 309 are exposed.

Figure 3J:
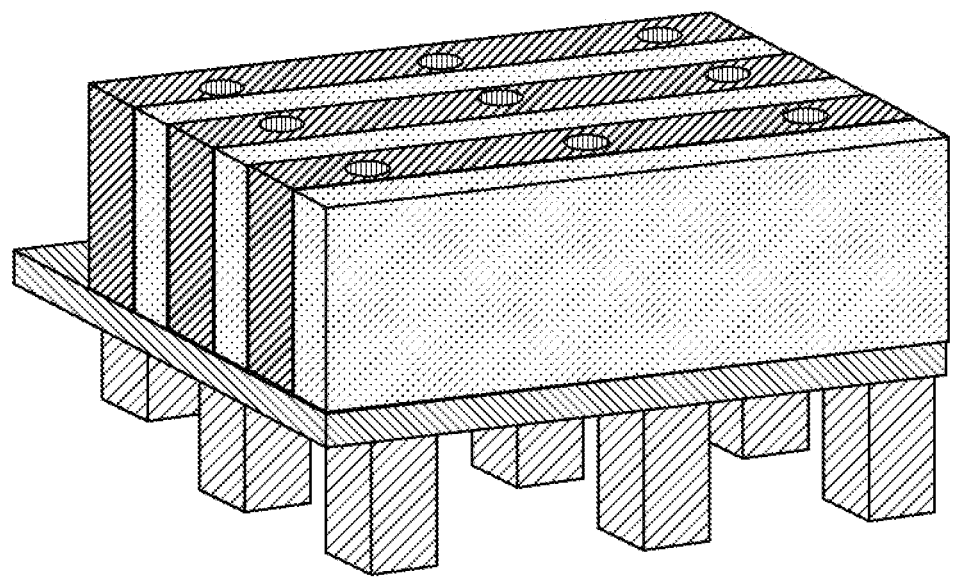

Referring to FIG. 3J, after one or more operations that result in the cross-section shown in FIG. 3I, the final structure is formed.

In an alternate embodiment, metal 315 can be deposited, metal 315 can be etched, and a fill with dielectric 313 can be performed to obtain the structure shown in FIG. 3I or FIG. 3J. In such embodiment, the metal can be etched away from the area between posts. This can protect the posts from being etched.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 4:
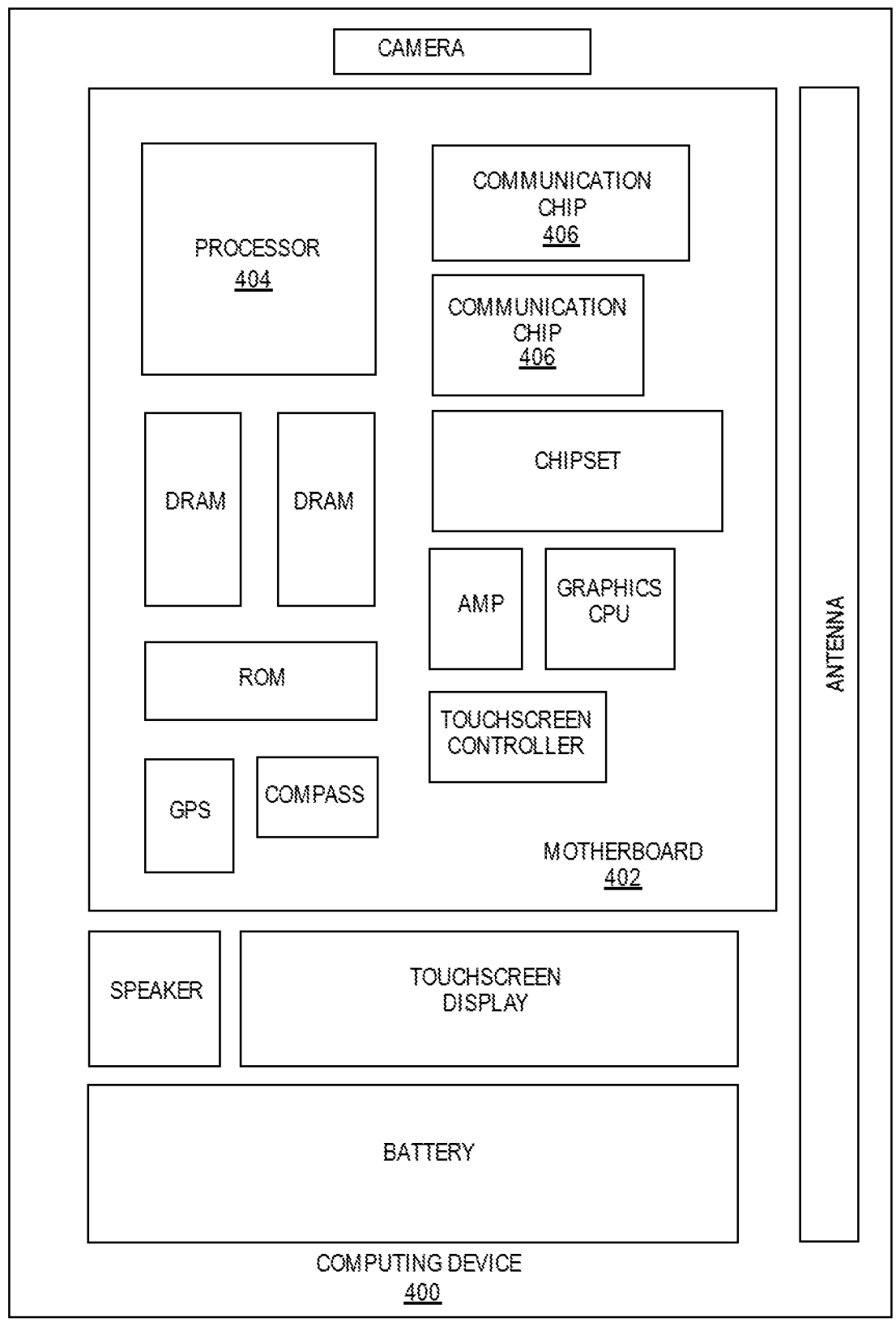
FIG. 4 illustrates a computing device in accordance with one implementation of the invention.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip includes one or more devices, such as MOS-FET transistors built in accordance with implementations of the invention.

In further implementations, another component housed within the computing device 400 may contain an integrated circuit die that includes one or more devices, such as MOS-FET transistors built in accordance with implementations of the invention.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Figure 5:
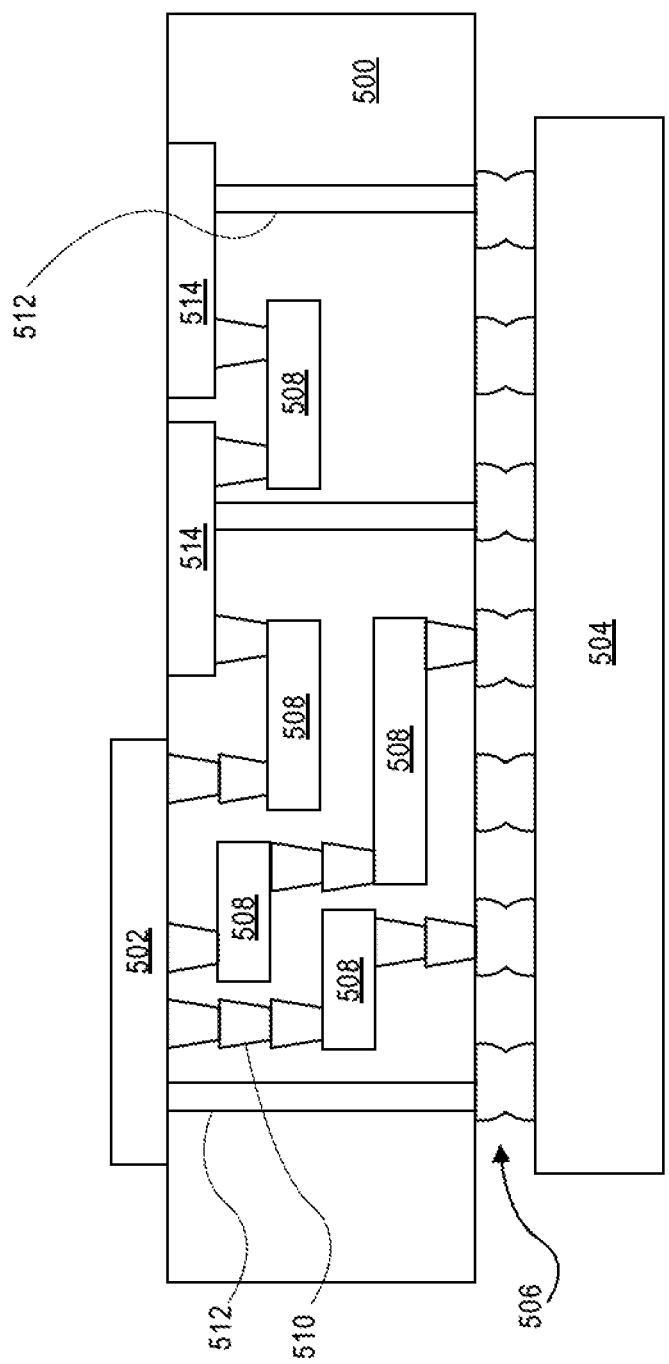
FIG. 5 illustrates an interposer that includes one or more embodiments of the invention.

FIG. 5 illustrates an interposer 500 that includes one or more embodiments of the invention. The interposer 500 is an intervening substrate used to bridge a first substrate 502 to a second substrate 504. The first substrate 502 may be, for instance, an integrated circuit die. The second substrate 504 may be, for instance, a memory module, a computer motherboard, or another integrated circuit die. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500. In accordance with embodiments of the invention, apparatuses or processes disclosed herein may be used in the fabrication of interposer 500.

Although specific embodiments have been described above, these embodiments are not intended to limit the scope of the disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example Embodiment 1

A memory cell includes a word line contact, a cylindrical electrode having a top region and a bottom region, and RRAM material covering the surface of the cylindrical electrode from the top region to the bottom region. A select transistor contact is coupled to the bottom region of the cylindrical electrode.

Example Embodiment 2

The memory cell of example embodiment 1, wherein the RRAM material includes binary oxides, ternary and more complex oxides, chalcogenides, nitrides, amorphous-silicon/carbon, or some organic materials.

Example Embodiment 3

The memory cell of example embodiment 1, wherein the area of the RRAM material is equal to the surface area of the cylindrical electrode.

Example Embodiment 4

The memory cell of example embodiment 1, wherein the area of the RRAM material is at least two times the product of the height of an ILD metal layer times the circumference of a via in which the cylindrical electrode is formed.

Example Embodiment 5

The memory cell of example embodiment 1, wherein the cylindrical electrode extends vertically upward from the select transistor contact.

Example Embodiment 6

The memory cell of example embodiment 1, wherein the cylindrical electrode is formed from metal or semiconductor.

Example Embodiment 7

The memory cell of example embodiments 1, 2, 3, 4, 5, or 6 wherein the word line contact surrounds the cylindrical electrode.

Example Embodiment 8

A memory cell array includes a plurality of bit lines, a plurality of word lines and a plurality of memory cells coupled to the plurality of word lines. The memory cells include a word line contact, a cylindrical electrode having a top region and a bottom region, and RRAM material covering the surface of the cylindrical electrode from the top region to the bottom region. A select transistor contact is coupled to the bottom region of the cylindrical electrode.

Example Embodiment 9

The memory cell array of example embodiment 8, wherein the RRAM material includes binary oxides, ternary and more complex oxides, chalcogenides, nitrides, amorphous-silicon/carbon, or some organic materials.

Example Embodiment 10

The memory cell array of example embodiment 8, wherein the area of the RRAM material is equal to the surface area of the cylindrical electrode.

Example Embodiment 11

The memory cell array of example embodiment 8, wherein the area of the RRAM material is at least two times the product of the height of an ILD metal layer times the circumference of a via in which the cylindrical electrode is formed.

Example Embodiment 12

The memory cell array of example embodiment 8, wherein the cylindrical electrode extends vertically upward from the select transistor contact.

Example Embodiment 13

The memory cell array of example embodiment 8, wherein the cylindrical electrode is formed from metal or semiconductor.

Example Embodiment 14

The memory cell array of example embodiments 8, 9, 10, 11, or 13 wherein the word line contact surrounds the cylindrical electrode.

Example Embodiment 15

A method includes forming a word line contact, forming a cylindrical electrode having a top region and a bottom region, and forming RRAM material covering the surface of the cylindrical electrode from the top region to the bottom region. A select transistor contact is coupled to the bottom region of the cylindrical electrode.

Example Embodiment 16

The method of example embodiment 15, wherein the RRAM material includes binary oxides, ternary and more complex oxides, chalcogenides, nitrides, amorphous-silicon/carbon, or some organic materials.

Example Embodiment 17

The method of example embodiment 15, wherein the area of the RRAM material is equal to the surface area of the cylindrical electrode.

Example Embodiment 18

The method of example embodiment 15, wherein the area of the RRAM material is at least two times the product of the height of an ILD metal layer times the circumference of a via in which the cylindrical electrode is formed.

Example Embodiment 19

The method of example embodiment 15, wherein the cylindrical electrode extends vertically upward from the select transistor contact.

Example Embodiment 20

The method of example embodiments 15, 16, 17, 18 or 19 wherein the cylindrical electrode is formed from metal or semiconductor.

What is claimed is:

1. A memory cell, comprising:
a word line;
a cylindrical electrode having a top region and a bottom region;
an RRAM material covering the surface of the cylindrical electrode from the top region to the bottom region, wherein the RRAM materal is in contact with the word line; and
a select transistor contact coupled to the bottom region of the cylindrical electrode.

2. The memory cell of claim 1, wherein the RRAM material includes binary oxides, ternary and more complex oxides, chalcogenides, nitrides, amorphous-silicon/carbon, or some organic materials.

3. The memory cell of claim 1, wherein the area of the RRAM material is equal to the surface area of the cylindrical electrode.

4. The memory cell of claim 1, wherein the area of the RRAIVI material is at least two times the product of the height of an ILD metal layer times the circumference of a via in which the cylindrical electrode is formed.

5. The memory cell of claim 1, wherein the cylindrical electrode extends vertically upward from the select transistor contact.

6. The memory cell of claim 1, wherein the cylindrical electrode is formed from metal or semiconductor.

7. The memory cell of claim 1, wherein the word line surrounds the cylindrical electrode.

8. A memory cell array, comprising:
a plurality of bit lines;
a plurality of word lines;
a plurality of memory cells coupled to the plurality of word lines, the memory cells comprising:
a word line of the plurality of word lines;
a cylindrical electrode having a top region and a bottom region;
an RRAM material covering the surface of the cylindrical electrode from the top region to the bottom region, wherein the RRAIVI materal is in contact with the word line; and
a select transistor contact coupled to the bottom region of the cylindrical electrode.

9. The memory cell array of claim 8, wherein the RRAM material includes binary oxides, ternary and more complex oxides, chalcogenides, nitrides, amorphous-silicon/carbon, or some organic materials.

10. The memory cell array of claim 8, wherein the area of the RRAM material is equal to the surface area of the cylindrical electrode.

11. The memory cell array of claim 8, wherein the area of the RRAM material is two times the product of the height of an ILD metal layer times the circumference of a via in which the cylindrical electrode is formed.

12. The memory cell array of claim 8, wherein the cylindrical electrode extends vertically upward from the select transistor contact.

13. The memory cell array of claim 8, wherein the cylindrical electrode is formed from metal or semiconductor.

14. The memory cell array of claim 8, wherein the word line surrounds the cylindrical electrode.

15. A method, comprising:
    forming a word line;
    forming a cylindrical electrode having a top region and a bottom region;
    forming an RRAM material to cover the surface of the cylindrical electrode from the top region to the bottom region, wherein the RRAM materal is in contact with the word line; and
    forming a select transistor contact that is coupled to the bottom region of the cylindrical electrode.

16. The method of claim 15, wherein the RRAM material includes binary oxides, ternary and more complex oxides, chalcogenides, nitrides, amorphous-silicon/carbon, or some organic materials.

17. The method of claim 15, wherein the area of the RRAM material is equal to the surface area of the cylindrical electrode.

18. The method of claim 15, wherein the area of the RRAM material is at least two times the product of the height of an ILD metal layer times the circumference of a via in which the cylindrical electrode is formed.

19. The method of claim 15, wherein the cylindrical electrode extends vertically upward from the select transistor contact.

20. The method of claim 15, wherein the cylindrical electrode is formed from metal or semiconductor.

21. A memory cell, comprising:
    a word line;
    a cylindrical electrode having a top region and a bottom region;
    an RRAM material covering the surface of the cylindrical electrode from the top region to the bottom region, wherein the area of the RRAIVI material is at least two times the product of the height of an ILD metal layer times the circumference of a via in which the cylindrical electrode is formed; and
    a select transistor contact coupled to the bottom region of the cylindrical electrode.

* * * * *